United States Patent [19]

Morgan

[11] 4,018,940

[45] Apr. 19, 1977

[54] PROCESS FOR FORMING SOLDER RESIST ANT PHOTORESIST COATINGS

[75] Inventor: Charles R. Morgan, Silver Spring, Md.

[73] Assignee: W. R. Grace & Co., New York, N.Y.

[22] Filed: Nov. 24, 1975

[21] Appl. No.: 634,719

Related U.S. Application Data

[60] Division of Ser. No. 330,818, Feb. 8, 1973, Pat. No. 3,925,320, which is a continuation-in-part of Ser. No. 250,554, May 5, 1972, abandoned.

[52] U.S. Cl. .................................. 427/54; 96/36.2; 204/159.14; 204/159.18; 204/159.19; 260/77.5 CR; 260/77.5 BB; 427/96; 427/97

[51] Int. Cl.$^2$ .......................................... B05D 3/06

[58] Field of Search ....... 260/874, 859 R, 77.5 CR, 260/77.5 BB; 427/96, 97, 54, 271; 96/36.2; 29/626; 204/159.14, 159.18, 159.19

[56] References Cited

UNITED STATES PATENTS

| | | | |
|---|---|---|---|
| 3,610,811 | 10/1971 | O'Keefe | 29/626 |
| 3,660,088 | 5/1972 | Lundsager | 96/36.2 |
| 3,832,421 | 8/1974 | Morgan | 96/36.2 |
| 3,925,320 | 12/1975 | Morgan | 29/626 |

Primary Examiner—Cameron K. Weiffenbach
Attorney, Agent, or Firm—Richard P. Plunkett; Kenneth E. Prince

[57] ABSTRACT

Novel styrene-allyl alcohol copolymer based solid polyene compositions which when mixed with liquid polythiols can form solid curable polyene-polythiol systems. These solid polyenes, containing at least two reactive carbon-to-carbon unsaturated bonds, are urethane or ester derivatives of styrene-allyl alcohol copolymers. The solid polyenes are prepared by treating the hydroxyl groups of a styrene-allyl alcohol copolymer with a reactive unsaturated isocyanate, e.g., allyl isocyanate or a reactive unsaturated carboxylic acid, e.g., acrylic acid. Upon exposure to a free radical generator, e.g., actinic radiation, the solid polyene-polythiol compositions cure to solid, insoluble, chemically resistant, cross-linked polythioether products. Since the solid polyene-liquid polythiol composition can be cured in a solid state, such a curable system finds particular use in preparation of coatings, imaged surfaces such as photoresists, particularly solder-resistant photoresists, printing plates, etc.

8 Claims, No Drawings

PROCESS FOR FORMING SOLDER RESISTANT PHOTORESIST COATINGS

This is a division of application Ser. No. 330,818, filed Feb. 8, 1973, now U.S. Pat. No. 3,925,320, which in turn is a continuation-in-part of Ser. No. 250,554, filed May 5, 1972, now abandoned.

BACKGROUND OF THE INVENTION

This invention relates to solid styrene-allyl alcohol based polyene compositions. More particularly, this invention relates to solid, solvent soluble curable compositions. comprising solid polyenes-liquid polythiols, method of preparing the same, as well as curing the solic polymer compositions in the presence of a free radical generator to solid, cross-linked, solvent-insoluble materials. More specificantly, this invention relates to solid photoresists and a method of preparing same.

It is known that polyenes are curable by polythiols in the presence of free radical generators such as actinic radiation to solid polythioether containing resinous or elastomeric products. In these prior art polyene-polythiol curable systems, either both the polyenes and polythiol were liquids, or one of the polymeric components was solid and the other liquid. Both liquid curable systems and the liquid-solid curable polymeric systems possess certain limitations and disadvantages. The use of curable liquid systems in preparation of photoimaged surfaces such as relief printing plates and photoresists have many undesirable features such as time consuming liquid coating operation which involves the use of cumbersome and additional apparatus, particularly expensive liqud dispensing equipment. A particular disadvantage of the liquid polymer systems is the resulting limited resolution during the photoimaging step, since it is necessary to maintain an air gap between the image, e.g., photographic negative and the liquid photocurable composition coated on a surface which is to be imaged in order to avoid marring the image and allowing its reuse.

Additionally, in the manufacture of certain printed circuits, when various photosensitive polymers are applied as liquid photoresists, they clog "thru-holes" in double sided or multi-layer printed circuits.

On the other hand, in the prior art solid polyene-liquid polythiol curable systems, the components are often incompatible, are not easily workable, or do not produce dry films, but only liquid curable compositions.

The novel solid curable polymer system of the present invention overcomes the numerous defects of prior art materials. The solid polyenes of this invention which are compatible with various liquid polythiols readily form solid curable compositions. These curable compositions can be compounded easily by mixing the solid polyenes and the liquid polythiols and be rapidly cured, particularly photocured in a solid state. The solid polyene-liquid polythiol mixtures are versatile photocurable compositions which are particularly useful in preparation of solid photoresists, solid relief or offset printing plates, coatings and the like. The subject photocurable polyene-polythiol compositions readily form dry solid film materials which can be easily handled and stored prior to utilizing them in photocuring processes such as photoresist formation. The dry film polymer compositions can be readily laminated on a desired solid surface such as photoresist formation, selective portions of the solid photocurable polymer composition are photocured and insolubilized, thereby forming a protective coating which shows excellent adhesion to metal surfaces such as copper.

In accordance with this invention, a solid curable polyene containing at least 2 reactive carbon to carbon bonds per molecule can be readily prepared from styrene-allyl alcohol copolymer starting materials. These styrene-allyl alcohol copolymer based polyenes, when admixed with liquid polythiols, form highly reactive compositions which are capable of being photocured when exposed to actinic radiation in the presence of a UV sensitizer to insoluble polythioether containing materials which exhibit excellent physical and chemical properties. For example, photoresist coatings formed from cured polyene-polythiol compositions containing styrene-allyl alcohol copolymer based solid polyenes and liquid polythiols are capable of withstanding severe chemical environments employed in the printed circuit board manufacturing processes. The subject cured materials resist strongly acid etching solutions or highly alkaline conditions of electroless metal plating baths. The desirable characteristics of the cured materials make the polyene-polythiol curable compositions containing styrene-allyl alcohol copolymer backbone based solid, polyene particularly useful in both subtractive and additive circuitry applications.

Generally speaking, the novel solid curable composition is comprised of a solid polyene component containing at least 2 reactive carbon to carbon unsaturated bonds per molecule which is a reaction product of a copolymer of styrene-allyl alcohol and at leeast one unsaturated organic compound such as ene-acid or ene-isocyanate; and a liquid polythiol component containing at least two thiol groups.

The formation of such solid polyenes may be schematically represented by the following non-limiting equation, wherein the unsaturated organic compound reactant is an ene-isocyanate having reactive allylic end groups as illustrated by a reaction product of one mole of 2,4-toluene diisocyanate with one mole of allyl alcohol:

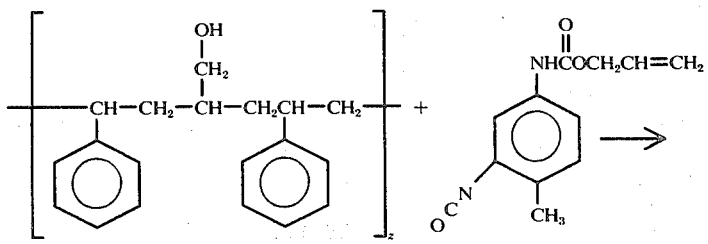

-continued

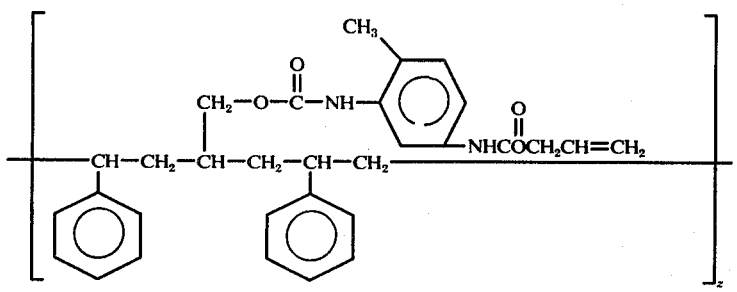

In the above equation, z is at least 2.

It is to be noted that in the above equation no attempt to show structural arrangement of the polymer is to be inferred.

Broadly, the operable polyene components of the solid curable composition are solid derivatives of styrene-allyl alcohol copolymers in which the reacting group is the hydroxyl functionality of the allyl alcohol portion of the copolymer. Operable solid polyenes include but are not limited to unsaturated ester and urethane derivatives of styrene-allyl alcohol copolymers.

As used herein, styrene-allyl alcohol copolymers refer to copolymers of an ethylenically unsaturated alcohol and a styrene monomer. Operable styrene-allyl alcohol copolymers are those containing from about 30 to 94 percent by weight of the styrene monomer, and preferably 60 to 85 percent by weight and correspondingly, from about 70 to 6 percent by weight of the ethylenically unsaturated alcohol, and preferably from about 40 to 15 percent on the same basis. In general, styrene-allyl alcohol copolymers having from about 1.8 to 10 percent hydroxyl groups by weight, preferably 4 to 8 percent.

The actual hydroxyl group content of the aforesaid copolymers may not always conform to the theoretical content calculated from the relative proportions of styrene monomer and ethylenically unsaturated alcohol, due to possible destruction of hydroxyl groups during copolymerization.

The styrene monomer moiety of said copolymer may be styrene or a ring-substituted styrene in which the substituents are 1–4 carbon atom alkyl groups or chlorine atoms. Examples of such ring-substituted styrenes include the ortho-, meta- and para-, methyl, ethyl, butyl, etc. monoalkyl styrenes; 2,3- 2,4-dimethyl and diethyl styrenes; mono-, di- and tri-chlorostyrenes; alkylchlorostyrenes such as 2-methyl-4-chlorostyrene, etc. Mixtures of two or more of such styrene monomer moieties may be present. The ethylenically unsaturated alcohol moiety may be allyl alcohol, methallyl alcohol, or a mixture thereof. For the purposes of brevity and simplicity of discussion, the entire class of copolymers set forth in this paragraph shall hereinafter be referred to simply as styrene-allyl alcohol copolymers.

The styrene-allyl alcohol copolymers may be prepared in several ways. One operable method which yields styrene-allyl copolymer starting materials which are solid products is taught in U.S. Pat. No. 2,630,430. A more desirable method of copolymerizing the styrene and allyl alcohol components in a substantially oxygen-free composition, thus minimizing the oxidative loss of hydroxyl groups, is disclosed, in U.S. Pat. No. 2,894,938.

Furthermore, the suitable styrene-allyl alcohol copolymers are generally commercially available materials.

The aforedescribed styrene-allyl alcohol copolymers are operable starting materials for the formation of the solid polyenes.

The polyenes of the subject invention have a molecular weight in the range of 332 to 20,000, preferably from 1200 to 10,000.

One group of operable polyenes containing styrene-allyl alcohol copolymer backbones are unsaturated urethane derivatives. These solid polyenes, i.e., unsaturated urethane derivatives of styrene-allyl alcohol copolymers may be represented by the general formula:

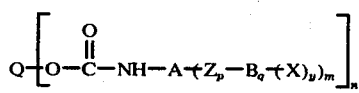

wherein Q is a styrene-allyl alcohol copolymeric moiety remaining after n hydroxyl groups of a said styrene-allyl alcohol copolymer, have reacted to form n urethane, i.e.,

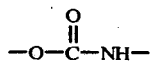

linkages; A and B are polyvalent organic radical members free of reactive carbon to carbon unsaturation and containing group members such as aryl, substituted aryl, aralkyl, substituted aralkyl, cycloalkyl, substituted cycloalkyl, alkyl and substituted alkyl containing 1 to 36 carbon atoms and mixtures thereof. These group members can be internally connected to one another by a chemically compatible linkage such as —O—, —S—, carboxylate, carbonate, carbonyl, urethane and substituted urethane, urea and substituted urea, amide and substituted amide, amine and substituted amine and hydrocarbon. Z is a divalent chemically compatible linkage such as

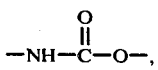

—O— and —S—, preferably

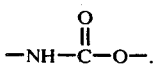

Preferred examples of operable aryl members are either phenyl or naphthyl, and of operable cycloalkyl members which have from 3 to 8 carbon atoms. Likewise, preferred substituents on the substituted members may be such groups as chloro, bromo, nitro, acetoxy, acetamido, phenyl, benzyl, alkyl and alkoxy of 1 to 9 carbon atoms, and cycloalkyl of 3 to 8 carbon atoms.

X is a member selected from the group consisting of:
a. $-(CH_2)_d-CR'=CHR$
b. $-O(CH_2)_d-CR'=CHR$
c. $-S-(CH_2)_d-CR'=CHR$
d. $-(CH_2)_d-C \equiv CR$
e. $-O-(CH_2)_d-C \equiv CR$
f. $-S-(CH_2)_d-C \equiv CR$ and mixtures thereof; and R and R' each are independently either a hydrogen or methyl radical, preferably a hydrogen radical; and $d$, $p$ and $q$ each are integers from 0 to 1; $y$ is an integer from 1 to 10, preferably 1 to 5; $m$ is an integer of at least 1, preferably from 1 to 4, and more particularly from 1 to 2, and $n$ is an integer of at least 1, and preferably 2 or greater, and more particularly from about 4 to 10, with the proviso that when $n$ is 1, $y$ or $m$ is at least 2.

As used herein, polyenes and polyynes refer to simple or complex species of alkenes or alkynes having a multiplicity of pendant or terminally reactive carbon to carbon unsaturated functional groups per average molecule. For example, a diene is a polyene that has two reactive carbon to carbon double bonds per average molecule, while a diyne is a polyyne that contains two reactive carbon to carbon triple bonds per average molecule; a solid polyene which is a reaction product of a styrene-allyl alcohol copolymer having about 8 hydroxyl groups per average molecule and a reactive unsaturated monoisocyanate having one terminal reactive carbon to carbon double bond per average molecule is a complex polyene which contains in its structure 8 reactive carbon to carbon double bonds per average molecule. For purposes of brevity, all these classes of compounds will be referred to hereafter as polyenes.

In defining the position of the reactive functional carbon to carbon unsaturation, the term terminal is intended to mean that functional unsaturation is at an end of the main chain in the molecule. The term pendant means that the reactive carbon to carbon unsaturation is located terminal in a branch of the main chain as contrasted to a position at or near the ends of the main chain. For purposes of brevity, all of these positions are referred to herein generally as terminal unsaturation.

Functionality as used herein refers to the average number of ene or thiol groups per molecule in the polyene or polythiol, respectively. For example, a triene is a polyene with an average of three reactive carbon to carbon unsaturated groups per molecule, and thus has a functionality (f) of three. A dithiol is a polythiol with an average of two thiol groups per molecule and thus has a functionality (f) of two.

The term reactive unsaturated carbon to carbon groups means groups which will react under proper conditions as set forth herein with thiol groups of yield the thioether linkage

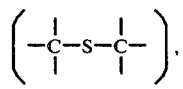

as contrasted to the term unreactive carbon to carbon unsaturation which means

groups found in aromatic nuclei (cyclic structures exemplified by benzene, pyridine, anthracene, and the like) which do not under the same conditions react with thiols to give thioether linkages. For purposes of brevity, this term will hereinafter be referred to generally as reactive unsaturation or a reactive unsaturated compound.

As used herein, the term polyvalent means having a valence of two or greater.

A general method of forming the urethane containing styrene-allyl alcohol copolymer based polyene is to react the styrene-allyl alcohol copolymer represented by a general formula $Q-(OH)_n$, in which n is at least 1 Q is as hereinbefore set forth; with at least one reactive unsaturated insocyanate of the general formula $NCO+A-Z_p-B_q-(X)_y]_m$ in which the members A, Z, B, X and the integers $p$, $q$, $y$ and $m$ are as hereinbefore set forth.

The term reactive unsaturated isocyanate will hereinafter be referred to as an ene-isocyanate or an yne-isocyanate.

The reaction is carried out in a moisture free atmosphere at atmospheric pressure at a temperature in the range from about 30° to 100° C, preferably from about 40° to 80° C, for a period of about 10 minutes to about 24 hours. The reaction is preferably a one step reaction wherein all the reactants are charged together. The ene-isocyanate or yne-isocyanate is added in a stoichiometric amount necessary to react with the hydroxy groups in the styrene-allyl alcohol copolymer. The reaction, if desired, may be carried out in the presence of a catalyst and inert solvent. Operable non-limiting catalysts include tin catalysts such as dibutyl tin dilaurate, stannous octoate; tertiary amines such as triethylene diamine or N,N,N',N'-tetramethyl-1,3-butanediamine, etc. Useful inert solvents include aromatic hydrocarbons, halogenated saturated aliphatic or aromatic hydrocarbons and mixtures thereof. Representative non-limiting examples include benzene, chlorobenzene, chloroform, 1,1,1-trichloroethane, 1,2-dichloroethane and the like.

Operable ene- or yne- isocyanates having the above defined general formula include, but are not limited to, simple monoeneisocyanates such as allyl isocyanate, 2-methallyl isocyanate, crotyl isocyanate, etc.

The aforementioned reactive unsaturated isocyanates are a group of compounds having the above general formula of operable ene- or yne-isocyanates wherein the integers $p$ and $q$ are $o$ and $m$ is 1. Thus, the urethane styrene-allyl alcohol copolymer based polyenes formed for these reactive unsaturated isocyanates may be represented by simplifyting the general formula for the polyenes to the followig specific formula:

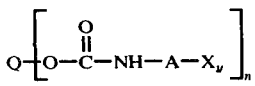

wherein preferably y is 1 and n is 2 and the other members being as hereinbefore set forth.

Other operable ene- or yne-isocyanates are those prepared by reacting a polyisocyanate of the general formula $A+(NCO)_x$, in which x is at least 2 and A is as hereinbefore set forth; with a reactive unsaturated alcohol of the general formula $[(X)_yB]-OH$ in which B, X and y are as hereinbefore set forth.

The above polyisocyanate and alcohol reactants are added in such stoichiometric amounts that x-1 isocyanate groups react to give x-1 urethane linkages.

Operable non-limiting examples of starting polyisocyanate reactants include hexamethylenediisocyanate, tolylene diisocyanate, xylylene diisocyanate, methylenebis(phenyl isocyanate), 4,4' -methylene(cyclohexyl isocyanate), 1-methoxy-2,4,6-benzenetrisocyanate, 2,4,4' -triisocyanatodiphenylether, diphenylmethane tetraisocyanates, polyisocyanates having various functional groups such as N,N',N''-tris-(isocyanatohexyl)-biuret or adducts of polyalcohols and diisocyanates which have at least 2 free isocyanate groups. Adduct of trimethylolpropane and 3 moles of tolune diisocyanate, is suitable.

Illustrative of the operable reactive unsaturated alcohols which may react with the polyisocyanates to give the desired eneisocyanate include but are not limited to allyl and methallyl alcohol, crotyl alcohol, crotyl alcohol, ω-undecylenyl alcohol, 2-vinyloxyethanol, vinylhydroxyethyl sulfide, propargyl alcohol, 1-allylcyclopentanol, 2-methyl-3-butene-2-ol. Reactive unsaturated derivatives of polyhydric alcohols such as glycols, triols, tetraols, etc., are also suitable. Representative examples include trimethylolpropane or trimethylolethane diallyl ethers, pentaerythritol triallyl ether and the like. Mixtures of various reactive unsaturated alcohols are operable as well. A suitable ene-isocyanate prepared by treating one mole of trimethylbenzene triisocyanate with two moles of trimethylolpropane diallyl ether. The resulting urethane containing ene-isocyanate is a polyene having four reactive allyl ether groups per molecule. Mixtures of various ene- or yne-isocyanates are operable as well.

Another class of solid polyenes operable in forming the solid curable polyene-polythiol system of the subject invention are esters of styrene-allyl alcohol copolymers. Similarly, these polyenes may be represented by the general formula

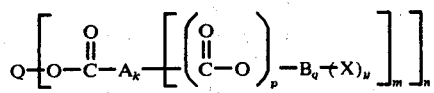

wherein Q is a styrene-allyl alcohol copolymeric moiety remaining after removal of n hydroxyl groups from a said styrene-allyl alcohol copolymer thereby forming an ester linkage; the members A, B, and X and integers p, q, y, n and m are as hereinbefore set forth in the urethane containing styrene allyl-alcohol copolymer based polyene and k is an integer from 0 to 1.

A general method of forming these esters is to react the styrene-allyl alcohol copolymer represented by the aforedefined general formula $Q-(OH)_n$; with at least one reactive unsaturated monocarboxylic acid of the general formula:

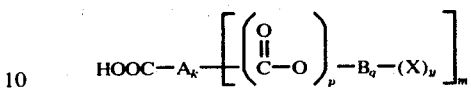

in which the members A, B and X and the integers k, p, q, y and n are as hereinbefore set forth. The term reactive unsaturated carboxylic acid will hereinafter be referred to as an ene- and/or an yne-acid.

The esterification reaction may be carried out in a conventional manner in the presence of an acid catalyst, the water formed during the reaction being removed as an azeotrope.

Operable ene- yne-acids include but are not limited to simple monoene-acids such as acrylic acid, methacrylic acid, vinylacetic acid, 5-hexenoic acid, 6-heptynoic acid, propiolic acid and the like.

These aforementioned reactive unsaturated acids are a groups of acids having the above general formula of operable ene- or yne-acids wherein the integers p and q and 0, and m is 1. Thus the ester containing styrene-allyl alcohol copolymer based polyenes formed from these reactive unsaturated acids may be represented by simplifying the general formula for the polyenes to the following specific formula:

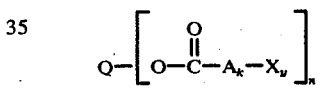

wherein, preferably, y is 1 and n is 2 and the other members being as hereinbefore set forth.

Other operable acids are those containing more than one terminally reactive unsaturated group in the molecule. These may be prepared by reacting a polycarboxylic acid of the general formula $A-(COOH)_x$, in which x is at least 2 and A is as hereinbefore set forth, with a reactive unsaturated alcohol of the general formula $[(X)_y-B]-OH$, in which B, X and y are as hereinbefore set forth.

The above polycarboxylic acid and alcohol reactants are added in such stoichiometric amounts that x-1 carboxylic groups react to give x-1 ester linkages.

Operable polycarboxylic acids include but are not limited to dicarboxylic acids such as adipic, tartaric, succinic, terephthalic, etc.

Operable reactive unsaturated alcohol components are the same as described above as being suitable in forming ene-isocyanates. As an example, a suitable ene-acid can be prepared by reacting one mole of trimethylolpropane diallyl ether with one mole of succinic anhydride in the presence of pyridine as a solvent. The resulting succinate product contains a free carboxylic groups as well as two reactive allyl ether groups.

The liquid polythiols used herein for curing to a 3 dimensional network are simple or complex organic compounds having a multiplicity of pendant or terminally positioned —SH functional groups per average molecule.

On the average the liquid polythiol used for curing must contain 2 or more —SH groups/molecule and have a viscosity range of slightly above 0 to 20 million centipoises (cps) at 25° C as measured by a Brookfield Viscometer. Operable polythiols used for curing in the instant invention usually have molecular weights in the range about 94 to about 20,000, and preferably from about 100 to about 10,000.

The liquid polythiols used for curing in the instant invention may be exemplified by the general formula $R_8$—$(SH)_x$ where $x$ is at least 2 and $R_8$ is a polyvalent organic radical member free from reactive carbon-to-carbon unsaturation. Thus $R_8$ may contain cyclic groupings and minor amounts of hetero atoms such as N, P or O but primarily contains carbon-carbon, carbon-hydrogen, carbon-oxygen, or silicon-oxygen containing chain linkages free of any reactive carbon-to-carbon unsaturation.

Certain polythiols such as the aliphatic monomeric polythiols (ethane dithiol, hexamethylene dithiol, decamethylene dithiol, tolylene-2,4-dithiol, and the like, and some polymeric polythiols such as a thiol-terminated ethyl-cyclohexyl dimercaptan polymer, and the like, and similar polythiols which are conveniently and ordinarily synthesized on a commercial basis, although having obnoxious odors, are operable but many of the end products are not widely accepted from a practical, commercial point of view.

One class of liquid polythiols operable with polyenes to obtain essentially odorless polythioether products are liquid esters of thiol-containing acids of the formula HS—$R_9$—COOH where $R_9$ is a polyvalent organic radical member containing no reactive carbon-to-carbon unsaturation with polyhydroxy compounds of structure $R_{10}$—$(OH)_x$ where $R_{10}$ is a polyvalent organic radical member containing no reactive carbon to carbon unsaturation, and $x$ is 2 or greater. These components will react under suitable conditions to give a polythiol having the general structure:

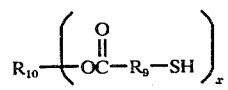

where $R_9$ and $R_{10}$ are polyvalent organic radical members containing no reactive carbon-to-carbon unsaturation, and $x$ is 2 or greater.

In the above formula for the polythiol ester $R_{10}$ is a radical member remaining after removal of $x$ hydroxyl groups from a polyhydric alcohol. $R_9$ is a polyvalent, particularly divalent organic radical member selected from the group consisting of aryl, substituted aryl, aralkyl, substituted aralkyl, cycloalkyl, substituted cycloalkyl, alkyl and substituted alkyl groups containing 1 to 16 carbon atoms.

Preferred examples of operable aryl members are either phenyl or benzyl, and of operable cyloalkyl members which have from 3 to 8 carbon atoms. Likewise, preferred substituents on said substituted members selected from the group consisting of nitro, chloro, bromo, acetoxy, acetamido, phenyl, benzyl, alkyl, and alkoxy and cycloalkyl; said alkyl and alkoxy having 1 to 9 carbon atoms and cycloalkyl of 3 to 8 carbon atoms.

Operable polyhydroxy compounds are polyhydric alcohols such as various glycols, triols, tetraols, pentaols, hexaols and the like. Non-limiting examples of polyhydric alcohols include simple aliphatic or cycloaliphatic polyols such as ethylene glycol 1,3 butanediol, trimethylolethane, 1,4-cyclohexanediol as well as halogenated derivatives such as 2-chloro-1,3-propanediol,2,3-dichloro-1,4-butanediol and the like.

Additional operable polyhydroxy compounds are glycols formed from poly (alkylene oxides) such as polyethylene glycols, polypropylene glycols, polybutylene glycols or mixed poly(alkylene oxide) glycols. Preferably, the molecular weight of these polyols is within the range of 300 to 25,000 and especially within the range of 1500 to 6000.

Other suitable polyhydric alcohols containing oxygen atoms in the main chain are those formed by addition of an alkylene oxide, especially ethylene or propylene oxide to a triol or higher polyol. A specific example of a preferred polyol is an ethoxylated pentaerythritol.

Operable mercaptocarboxylic acids include but are not limited to thioglycollic acid (mercaptoacetic acid), α-mercaptopropionic acid, β-mercaptopropionic acid, 4mercaptobutyric acid, mercaptoundecyclic acid, mercaptostearic acid, and o-and p-mercaptobenzoic acids. Preferably, α or β -mercaptopropionic acid or thioglycollic acids are employed, since polythiol esters derived from these acids generally possess relatively low odor level and are compatible with the subject solid polyenes.

Specific examples of the preferred polythiols include but are not limited to ethylene glycol bis (thioglycolate), ethylene glycol bis (β-mercaptopropionate), trimethylolpropane tris (thioglycolate), trimethylolpropane tris (β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis (β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, compatibility with the solid polyenes and after reaction, give essentially odorless polythioether end products which are commercially attractive and practically useful solid cured polymeric materials for both indoor and outdoor applications.

The polythiol esters may be prepared in a conventional manner, e.g., by reaction of the polyhydric alcohol component with the mercaptocarboxylic acid in the presence of an acid catalyst, the water formed during the reaction being removed as an azeotrope with a suitable solvent.

In summary, by admixing the novel solid styrene-allyl alcohol copolymer based polyenes with various liquid polythiols and thereafter exposing the solid mixture at ambient conditions to a free radical generator, a solid, cured insoluble polythioether product is obtained.

Prior to curing the solid polyene and liquid polythiol, components are admixed in a suitable manner so as to form a homogenous solid curable mixture. Thus, the polyene and polythiol reactants may be dissolved in a suitable solvent and thereafter the solvent can be removed by suitable means such as evaporation.

To obtain the maximum strenght, solvent resistance, creep resistance, heat resistance and freedom from tackiness, the reactive components consisting of the polyenes and polythiols are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of various solid polyenes and various liquid polythiols containing said functionality are also operable herein.

The solid compositions to be cured in accord with the present invention may, if desired, include such additives as antioxidants, accelerators, dyes, inhibitors, activators, fillers, thickeners, pigments, anti-static agents, flame-retardant agents, surface-active agents, extending oils, plasticizers and the like within the scope of this invention. Such additives are usually pre-blended with the polyene or polythiol prior to or during the compounding step. The aforesaid additives may be present in quantities up to 500 or more parts based on 100 parts by weight of the polyene-polythiol curable compositions and preferably 0.005-300 parts on the same basis.

The solid polythioether-forming components and compositions, prior to curing may be admixed with or blended with other monomeric and polymeric materials such as thermoplastic resins, elastomers or thermosetting resin monomeric or polymeric compositions. The resulting blend may be subjected to conditions for curing or co-curing of the various components of the blend to give cured products having unusual physical properties.

Although the mechanism of the curing reaction is not completely understood, it appears most likely that the curing reaction may be initiated by most any free radical generating source which dissociates or abstracts a hydrogen atom from an SH group, or accomplishes the equivalent thereof. Generally, the rate of the curing reaction may be increased by increasing the temperature of the composition at the time of initiation of cure. In many applications, however, the curing is accomplished conveniently and economically by operating at ordinary room temperature conditions.

Operable curing initiators or accelerators include radiation such as actinic radiation, e.g., ultraviolet light, lasers; ionizing radiation such as gamma radiation, x-rays, corona discharge, etc.; as well as chemical free radical generating compounds such as azo, peroxidic, etc., compounds.

Azo or peroxidic compounds (with or without amine accelerators) which decompose at ambient conditions are operable as free radical generating agents capable of accelerating the curing reaction include benzoyl peroxide, di-t-butyl peroxide, cyclohexanone peroxide with dimethyl aniline or cobalt naphthenate as an accelerator; hydroperoxides such as hydrogen peroxide, cumene hydroperoxide, t-butyl hydroperoxides, peracid compounds such as t-butylperbenzoate, peracetic acid; persulfates, e.g., ammonium persulfate; azo compounds such as azobis-isobutyronitrile and the like.

These free radical generating agents are usually added in amounts ranging from about 0.001 to 10 percent by weight of the curable solid polyene-polythiol composition, perferably 0.01 to 5 percent.

The curing period may be retarded or accelerated from less than 1 minute to 30 days or more.

Conventional curing inhibitors or retarders which may be used in order to stabilize the components or curable compositions so as to prevent premature onset of curing may include hydroquinone; p-tert-butyl catechol; 2,6-di tert-butyl-p-methylphenol; phenothiazine; N-phenyl-2-naphthylamine; phosphorous acid; pyrogallol and the like.

The preferred free radical generator for the curing reaction is actinic radiation, suitably in the wavelength of about 2000 to 7500A, preferably for 2000 to 4000A.

A class of actinic light useful herein is ultraviolet light, and other forms of actinic radiation which are normally found in radiation emitted from the sun or from artificial sources such as Type RS Sunlamps, carbon arc lamps, xenon arc lamps, mercury vapor lamps, tungsten halide lamps and the like. Ultraviolet radiation may be used most efficiently if the photocurable polyene/polythiol composition contains a suitable photocuring rate accelerator. Curing periods may be adjusted to be very short and hence commercially economical by proper choice of ultraviolet source, photocuring rate accelerator and concentration thereof, temperature and molecular weight, and reactive group functionality of the polyene and polythiol. Curing periods of less than about 1 second duration are possible, especially in thin film applications such as desired, for example, in coatings, adhesives and photoimaged surfaces.

Various photosensitizers, i.e., photocuring rate accelerators are operable and well known to those skilled in the art. Examples of photosensitizers include, but are not limited to, benzophenone o-methoxybenzophenone, acetophenone, o-methoxyacetophenone, acenaphthene-quinone, methyl ethyl ketone, valerophenone, hexanophenone, α-phenylbutyrophenone, p-morpholinopropiophenone, dibenzosuberone, 4-morpholinobenzophenone, benzoin, benzion methyl ether, 4'-morpholinodeoxybenzion, p-diacetylbenzene, 4-aminobenzophenone, 4'-methoxyacetophenone, benzaldehyde, o-methoxybenzaldehyde, γ-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9one, 7-H-benz[de]anthracen-7-one, 1-naphthaldehyde, 4,4'-bis(dimethylamino)-benzophenone, fluorene-9-one, 1'-acetonaphthone, 2'-acetonaphthone, triphenylphosphine, tri-o-tolylphosphine, acetonaphthone and 2,3-butanedione, benz[a]anthracene 7,12 dione, etc., which serve to give greatly reduced exposure times and thereby when used in conjuction with various forms of energetic radiation yield very rapid, commercially practical time cycles by the practice of the instant invention.

These photocuring rate accelerators may range from about 0.005 to 50 percent by weight of the solid photocurable polyene-polythiol composition, preferably 0.05 to 25 percent.

The mole ratio of the ene/thiol groups for preparing the solid curable composition is from about 0.2/1.0 to about 8/1.0, and preferably from 0.5/1.0 to about 2/1.0 group ratio.

The solid curable polyene-polythiol compositions containing styrene-allyl alcohol copolymer based solid polyenes are used in preparing solid, cured cross-linked insoluble polythioether polymeric products having many and varied uses, examples of which include, but are not limited to, coatings; adhesives; films; molded articles; imaged surfaces, e.g., solid photoresists; solid printing plates; e.g., offset, lithographic, letterpress, gravures, etc., silverless photographic materials and the like.

Since the cured materials formed from the solid polyene-liquid polythiol compositions possess various desirable properties such as resistance to severe chemical and physical environments, they are particularly useful for preparing imaged surfaces.

A general method for preparing coatings, particularly imaged surfaces such as photoresists, printing plates, etc., comprises coating the solid curable composition on a solid surface of a substrate such as plastic, rubber, glass, ceramic, metal, paper and the like; exposing image-wise either directly using "point" radiation or through an image bearing transparency, e.g., photographic negative or positive or a mask, e.g., stencil, to radiation, e.g., U.V. light until the curable composition cures and cross-links in the exposed areas. After imagewise esposure, the uncured, unexposed areas are removed, e.g., with a appropriate solvent, thereby baring the unprotected surface of the substrate in selected areas. The resulting products are cured latent images on suitable substrates or supports. In case or preparing printing plates, e.g., a flexible relief plate wherein the substrate is usually a plastic material, the imaged product is ready for use. However, in other cases, e.g., in printed circuit manufacture or in chemical milling, the cured polymer composition acts as a photoresist.

The solid curable polyene-polythiol compositions of the subject invention are extremely suitable for use as a photoresist composition since (1) it adheres to the substrate firmly and readily on photocuring, (2) is resistant to the etching and plating environments for the substrate as well as soldering environments and (3) is easily removed by a solvent which does not affect the protected area.

Thus, in the preparation of an imaged surface by one operable photoresist process, the solid photocurable polyene-polythiol composition is coated or laminated onto an etchable solid surface, preferably a metal or metal clad substrate, as a solid, tack-free layer; exposed through an image bearing transparency to a free radical generator such as actinic radiation suitably in the wavelength range from about 2000 to 7500A or ionizing radiation to selectively cure the exposed portion of the composition, thus baring the metal beneath the removed uncured portion of the composition, optionally removing the exposed metal from the substrate to the desired depth and thereafter optionally removing the cured composition, thus leaving defined metal areas on the substrate.

In the printed circuit board manufacturing processes, the solid surface or board is usually electrically insulating substrate such as ceramic, thick plastic, epoxy, glass, etc., which can be clad with an etchable metal such as copper, aluminum, nickel, stainless steel and the like.

The above process illustrates the use of the solid photoresist in substractive circuitry applications, however, the subject solid photoresist compositions are very satisfactory for use in additive circuitry applications which utilize electroless metal plating processes which generally have highly caustic plating baths and thus require an extremely resistant photoresist material. Typical electroless metal plating baths, as well as conventional sensitizing and activating solutions utilized in additive circuit processes are disclosed in U.S. Pat. Nos. 3,546,009 and 3,573,973.

Various metals such as copper, nickel, gold, silver, tin, lead, etc., may be plated on metal clad substrates by conventional metal depositing techniques other than electroless plating, such as electroplating, chemical vapor deposition, flow soldering coating techniques and the like. The subject photocured resist composition are capable of withstanding the various metal depositing environments.

The solid film of photocurable composition can be formed by coating a solution or dispersion onto the metal cladding of a substrate and drying the layer by removal of the solvent by any suitable means, such as evaporation. The solid photoresist compositions may also be melted and suitably applied directly onto the metal surface of a metal clad substrate. Coating may be carried out by any of the conventional coating procedures such as spraying, dip coating, roller coating or curtain coating.

The photocurable resist layer has usually a dry coating thickness of about 1 mil, although it may range from 0.015 to about 5 mils or more, e.g., layers up to 10 mils are satisfactory.

In forming the solid photoresist composition comprised of the solid polyene and liquid polythiol, it is desirable that the photocurable composition contain a photocuring rate accelerator from about 0.005 to 50 parts by weight based on 100 parts by weight of the aforementioned polyene and polythiol.

It is to be understood, however, that when energy sources, e.g., ionizing radiation, other than visible or ultraviolet light, are used to initiate the curing reaction, photocuring rate accelerators (i.e., photosensitizers, etc.) generally are not required in the formulation.

When U.V. radiation is used for the curing reaction, a dose of 0.0004 to 6.0 watts/cm$^2$ is usually employed.

The thickness of the metal or metal cladding on the substrates may vary from 0.1 mil to 20 mils, depending on the desired end use.

The following examples will aid in explaining, but should not be deemed limiting, the instant invention. In all cases unless otherwise noted, all parts and percentages are by weight.

PREPARATION OF SOLID POLYENES

EXAMPLE 1

In a 1-liter flask maintained under a nitrogen atmosphere and equipped with a stirrer, thermometer, condenser and a gas inlet and outlet, was added 348 g (2.0 moles) of toluene diisocyanate (a 80/20 mixture of the 2,4 and 2,6 isomers). 116 g (2.0 moles) of allyl alcohol was slowly added over a period of 2 hours to the reaction vessel with stirring during which time the exotherm and reaction temperature were maintained below about 70° C. After the addition of the allyl alcohol was completed the reaction was continued for about 15 hours at about 25° C. The thus formed liquid monoallyl urethane had an NCO content of 4.13 meg/g and an unsaturation of 4.5 mmoles/g. This product will hereinafter be referred to as ene-isocyanate A.

EXAMPLE 2

110 g of a copolymer of styrene allyl alcohol having an equivalent weight of about 220 and a hydroxyl content of about 7.7 percent and commercially available from Monsanto Company under the tradename RJ 101, was dissolved in 300 ml of benzene in a 1-liter reaction flask maintained under a nitrogen atmosphere and equipped with a stirrer, condenser, thermometer and a gas inlet and outlet. 0.6 g of dibutyltin dilaurate as a catalyst was added to the reaction flask followed by dropwise addition over a period of ½ hour of 116 g of the ene-isocyanate A prepared in Example 1. The reaction was allowed to continue for about 15 hours while maintaining the temperature at about 70° C. Thereafter, the reaction mixture was cooled to room temperature and the solvent was removed under vacuum. The resulting solid polyene having a styrene-allyl alcohol based polymeric backbone (190 g) had an unsaturation of 2.2 mmoles/g and a melting point of 85°–105° C. This polyene will hereinafter be referred to as Polyene A.

EXAMPLE 3

Example 2 was repeated except that 150 g of a copolymer of styrene-allyl alcohol having an equivalent weight of about 300 and a hydroxyl content of about 5.7 percent and commercially available from Monsanto Company under the tradename RJ 100, instead of the RJ 101 was employed as the styreneallyl alcohol copolymer backbone and the benzene solvent was replaced by 1,2-dichloroethane. The resulting solid was an allyl terminated polyene having a styrene-allyl alcohol copolymer based polymeric backbone. This polyene will hereinafter be referred to as Polyene B.

EXAMPLE 4

220 g of a copolymer of styrene allyl-alcohol having an equivalent weight of about 220 and a hydroxyl content of about 7.7 percent and commercially available from Monsanto Company under the tradename RJ 101, and 72.0 g acrylic acid along with 400 ml of benzene as solvent and 1.5 g of p-toluenesulfonic acid as a catalyst were charged to a resin kettle equipped with a stirrer, condenser, Dean Stark trap, thermometer and gas inlet and outlet. The mixture was heated to reflux and the benzene-water azeotrope was collected. The amount of water obtained was about 16.0 ml. The reaction mixture was then diluted with 400 ml benzene and washed two times with 250 ml portions of 10 percent sodium bicarbonate solution to remove the excess unreacted acid. The thus treated mixture was then vacuum-stripped to remove the benzene. The mixture was then dried in a vacuum oven at 40° C resulting in a solid polyene containing acrylic acid ester group and styrene-allyl alcohol copolymer based polymeric backbone. This solid polyene has an unsaturation of 2.5 mmoles/g and a melting point from about 83°–87° C. This polyene will hereinafter be referred to as Polyene C.

EXAMPLE 5

To a 1 liter flask maintained under nitrogen atmosphere and equipped with a stirrer, thermometer condenser and a gas inlet and outlet, was added 174 g (1.0 mole) of toluene diisocyanate. To this reaction vessel 224 g (1.0 mole) of trimethylol-propane diallyl ether was added at a slow rate to maintain the reactor temperature under 65° C. After the addition of all the diallyl ether containing alcohol, the reaction was continued for 1 hour while maintaining the temperature at about 65° C. The reaction mixture was kept at room temperature overnight. The resulting product showed an isocyanate (NCO) content of 2.34 meg/g, which indicates that the diallyl ether terminated monourethane was formed. This product will be referred to herein as ene-isocyanate E.

EXAMPLE 6

A round bottom flask is fitted with a stirrer, thermometer, dropping funnel, nitrogen inlet and outlet. The flask can be placed in a heating mantle or immersed in a water bath, as required.

Two moles (448 g) of trimethylol-propane diallyl ether were mixed with 0.2 cc of dibutyl tin dilaurate under nitrogen. One mole of tolylene 2,4-diisocyanate was added to the mixture, using the rate of addition and cooling water to keep the temperature under 70° C. The mantle was used to keep the temperature at 70° C for another hour. Isocyanate analysis showed the reaction to be essentially complete at this time. The resulting viscous product, an allyl terminated urethane polyene having four reactive ene groups, will hereinafter be referred to as liquid Polyene $E_2$.

The above Polyene $E_2$ exemplifies a liquid polyene containing at least 2 reactive carbon-to-carbon bonds per molecule and having a viscosity in the range of 0–20 million centipoises at 70° C. The backbone of these polyenes is free of reactive carbon-to-carbon unsaturation. This group of polyenes is illustrated in U.S. Pat. No. 3,661,744. These liquid polyenes may be added in the subject solid photocurable compositions in amounts ranging from about 0.10 to 15 parts by weight of 100 parts by weight of solid polyene and liquid polythiol.

EXAMPLE 7

110 g of a copolymer of styrene allyl alcohol having an equivalent weight of about 220 and a hydroxyl content of about 7.7 percent and commercially available from Monsanto Company under the tradename RJ 101, was dissolved in 300 ml of 1,2-dichloroethane in a 1 liter reaction flask maintained under a nitrogen atmosphere and equipped with a stirrer, condenser, thermometer and a gas inlet and outlet. 0.16 g of stannous octoate as a catalyst was added to the reaction flask, followed by dropwise addition over a period of one-half hour of 116 g of the ene-isocyanate E prepared in Example 5. The reaction mixture was cooled to room temperature and the solution poured into petroleum ether in an explosion proof Waring Blender to precipitate a white solid which was then filtered and dried. The resulting solid polyene having a styrene-allyl alcohol based polymeric backbone had an unsaturation of 3.33 mmoles/g and melted at 60° C. This polyene will hereinafter be referred to as Polyene D.

CURING PROCESSES

EXAMPLE 8

An admixture of 2.0 g of solid Polyene A from Example 2, 0.6 g of pentaerythritol tetrakis (β-mercaptopropionate), a liquid polythiol commercially available from Carlisle Chemical Co. under the tradename "Q-43" and 0.15 g of benzophenone was dissolved in 20 g of methyl ethyl ketone. The solution was spin coated to the copper surface of a clean copper clad epoxy-glass printed circuit board blank. The methyl ethyl ketone was allowed to evaporate leaving a 1.0 mil solid photo-curable coating of the admixture on the copper. A negative image-bearing transparency of a printed circuit was placed in contact with and over the coating, and the photo-curable coating was exposed through the transparency to UV radiation from 8,000 watt Ascorlux pulsed xenon arc lamp at a surface intensity of 4000 microwatts/cm² for about 2 minutes. The major spectral lines of this lamp are all above 3000A. The negative transparency was removed and the coating was washed in acetone to remove the unexposed, uncured portion thereof, thus exposing the copper thereunder. The imaged circuit board was then etched by spraying it with a ferric chloride solution 42° Baume for about 5 minutes at 50° C to remove the exposed copper, followed by a water wash. The cured photoresist coating which was not affected by the etching solution was left on the etched printed circuit board as a protective cover for the desired electrical circuit thereunder.

EXAMPLE 9

An admixture of 10.0 g of solid Polyene C from Example 4, 2.5 g of the liquid polythiol "Q-43", 0.12 g of benzophenone and 0.003 g of phosphorous acid was dissolved in 15 g of chloroform. The solution was coated onto a about 5 mil thick polyethylene terephthalate i.e. "Mylar" film in a layer of approximately 5 mil thickness by means of a drawbar. After allowing the chloroform to evaporate, a solid non-tacky photocurable coating of about 2.5 mil was left on the support film. Thereafter the solid photocurable coating on the "Mylar" film was brought in contact with a clean copper surface of a circuit board comprising a 0.001 inch thick copper cladding on a 0.050 inch epoxy glass substrate. Heat (60° C) and pressure were applied to form the solid laminate which showed good adhesion to the copper surface. A negative image bearing transparency of a printed circuit was placed in contact with and over the "Mylar" film and the solid photocurable coating was exposed through the transparency and UV transparent polyethylene terephthalate film to UV radiation from a 8000 watt Ascorlux pulsed xenon arc lamp at a surface intensity of 4000 microwatts/cm² for about 2 minutes. The major spectral lines of this lamp are all above 3000 A. The negative transparency was removed and the "Mylar" film was stripped off. The coating was washed in trichloroethylene to remove the unexposed, uncured portion thereof, thus exposing the copper thereunder. The imaged circuit board was then etched by spraying it with a ferric chloride solution 42° Baume for about 5 minutes at 50° C to remove the exposed copper, followed by a water wash. The cured photoresist coating was then removed in methylene chloride solution, thus revealing the desired copper electrical circuit.

The following examples illustrate the use of the subject solid photocurable compositions as solder-resistant photoresists in the manufacture of printed circuit boards having electrical components soldered thereto.

EXAMPLE 10

A photocurable composition was prepared by admixing 952.3 g of 1,2-dichloroethane solution containing 389.5 g of the solid polyene A of Example 2 with 110.5 g of the liquid polythiol "Q-43," 40 g of benzophenone, 0.75 g of phosphorous acid, 0.05 g hydroquinone, 0.025 g pyrogallol and 25.0 g of n-butyl phthalate. This photocurable composition was coated in a layer of approximately 20 mils by means of a drawbar onto a 2 mil thick transparent polyethylene terephthalate, i.e., Mylar film which had been placed on a leveled platen heated to 78° C. After drying, a solid photocurable coating of about 8 mils was left on the Mylar support film. Using a commercial dry film laminating machine equipped with pressure rolls and heated at about 160° F, the surface of the Mylar backed dry photocurable coating was laminated onto a cleaned surface of a conventional double-sided plated through-hole printed circuit board. Both surfaces of the printed circuit board have tin-solder layers plated over a copper circuit. The circular pad areas of the solder-plated copper circuits have drilled through-holes to allow the connecting lead of the electrical components to be soldered thereto. The board was placed in a vacuum frame of an exposure unit and a negative transparency of the circuit in which the pad areas are opaque is registered on the upper surface of the board. The solid photocurable coating was exposed through the transparency to UV radiation from an 8000 watt Ascorlux pulsed xenon arc lamp at a surface intensity of 3000 microwatts/cm² for about 6 minutes, thereby curing the photocurable solder resist composition in all areas except those corresponding to the pads having the through-holes. Following the exposure, the negative is removed and the Mylar support film is stripped off. The unexposed, uncured solder resist composition was washed off the circuit board, thus baring the unexposed tin-solder plated pad areas of the circuit. This development was carried out in a commercial spray developer for 45 seconds using a solvent containing a mixture of 1,2-dichloroethane and 10 percent by volume of an alkylated aryl polyether alcohol surfactant commercially available from Rohm & Haas Co. under the tradename Triton X-100. Thereafter the circuit board was given a thorough water rinse followed by a drying treatment in two successive high velocity forced air ovens. The circuit board was dried at 65° C for 1 hour in the first oven and at 90° C for one-half hour in the second oven.

The photocured resist protected printed circuit board was then submitted to a soldering treatment in a commercial wave soldering apparatus. The leads of the electrical components are inserted through the pads in the circuit board, and the board was passed over a foaming flux, i.e., "Milfoam-613 Flux," a rosin based isopropyl alcohol containing flux commercially available from Alphametals Inc., Jersey City. N.J., to coat the areas to be soldered with flux. The board was then conveyed over a preheater which preheated the circuit board to a temperature of about 210° F and then over a solder bath containing 63/37 tin-lead alloy maintained at 500° F. The solder contacts the underside of the board, thereby soldering all the contact leads extending therethrough to the circuit board. After washing the board with the soldered components in a suitable solvent such as 1,1,1-trichloroethane or ethylene dichloride to remove residual flux and solder oil, the board was then dried. Inspection of the board showed that the cured solder resist composition withstood the soldering environment and adhered well to the board.

EXAMPLE 11

Example 10 was repeated except that the aforementioned photocurable composition contained 12.0 g of n-butyl phthalate and 25.0 g of liquid Polyene $E_2$ from Example 6 and prior to submitting the circuit board to the soldering treatment the developed board was first dried in a 75° C oven for 1 hour and then in a 95° C oven for ½ hour. Inspection of the board showed that the electrical components were securely soldered to the circuit board and that the cured solder resist composition was unaffected by the soldering steps and adhered well to the board.

EXAMPLE 12

A photocurable composition was prepared by admixing 400 g of a 1,2-dichloroethane solution of the solid Polyene D in Example 7 (as 46 weight percent solids) with 41.0 g of "Q-43," 18 g of benzophenone, 0.68 g hydroquinone, 1.0 g pyrogallol and 0.88 g phosphorous acid. A dry solid photocurable layer of about 6 mils was formed on a Mylar support film using the coating techniques described in Example 10. The surface of this supported photocurable layer was laminated to the surface of a plated through-hole printed circuit board, exposed, and developed in the manner outlined in Example 10, except that the length of exposure to UV radiation was 4 minutes, development of the exposed layer to wash off the uncured photocurble layer was 1 minute, and the drying treatment was carried out first in a 75° C oven for 15 minutes and then in an 90° C oven for 45 minutes.

The photocured resist protected printed circuit board was subjected to a soldering treatment described in Example 10. Inspection of the board showed that the electrical components were securely soldered to the circuit board and that the cured solder resist composition withstood the soldering environment and adhered well to the board.

It is noted in the above examples only one surface of the double sided printed circuit board was coated with the subject solder resistant photoresist compositions. If desired, the coating with solder resist layer, exposure and development steps can be repeated on the other surface of the printed circuit board. Similarly, the subject solder resistant photoresists can be utilized in soldering operations employing single sided printed circuit boards.

The molecular weight of the polyenes and polythiols of the present invention, as well as the starting styrene-allyl alcohol copolymer materials of this invention, may be measured by various conventional methods including solution viscosity, osmotic pressure and gel permeation chromatography. Additionally, the molecular weight may be calculated from the known molecular weight of the reactants.

As can be seen from the above detailed description, the subject solid curable and particularly photocurable compositions comprised of compatible solid polyenes and solid polythiols having similar polymeric backbones based on styrene-allyl alcohol copolymers exhibit extremely satisfactory chemical and physical properties and are versatile curable polymeric systems which do not possess the many drawbacks of liquid curable polymer compositions.

A desirable characteristic of these solid photocurable polyene-polythiol compositions is that solid films of the same may be formed easily by known film forming techniques and the solid photosensitive film can be packaged as a sandwich between removable protective cover sheets such as polyolefin films and a flexible, usually UV transparent, support polymeric film composed of polyesters, cellulose esters, polyamides, etc. In this manner they can be easily stored and handled and when ready for use can be directly laminated, usually under pressure and heat, to the desired solid surface, e.g., metal clad printed circuit board. The solid uncured polyene-polythiol composition adheres very satisfactorily to various surfaces, particularly to copper.

It is understood that the foregoing detailed description is given merely by way of illustration and that many variations may be made therein without departing from the spirit of this invention.

This present application is a continuation-in-part application of copending application Ser. No. 250,554, filed May 5, 1972.

What is claimed is:

1. A process of forming a solder resistant photoresist on a printed circuit board which comprises:
   A. applying to the electrically conductive surface of a printed circuit board having holes therethrough a solid layer of a solder resistant photocurable composition consisting essentially of
      1. a solid polyene which is a reaction product of a styrene-allyl alcohol copolymer and a member selected from the group consisting of at least one reactive unsaturated monoisocyanate and at least one reactive unsaturated monocarboxylic acid, said polyene containing at least 2 reactive carbon to carbon bonds per molecule; and
      2. a liquid polythiol containing at least 2 thiol groups per molecule, the total combined functionality of (a) the reactive unsaturated carbon to carbon bonds per molecule in the polyene and (b) the thiol groups per molecule in the polythiol being greater than 4;
   B. imagewise exposing selected areas of said composition to actinic radiation, thereby curing the exposed areas of said composition;
   C. removing the unexposed uncured areas of the curable composition, thereby exposing the surface of said printed circuit board beneath the removed uncured areas of the composition
   D. inserting the leads of electrical components where desired through the holes in the bared areas of the printed circuit board;
   E. passing the printed circuit board over a flux bath, and thereafter over a solder bath maintained at a temperature in the range of 400° to 600° F, thereby soldering said electrical components to said board; and
   F. removing the cured solder resistant composition from said board.

2. The process according to claim 1 wherein (1) said polyene is selected from the group consisting of polyene compounds having the general formula:

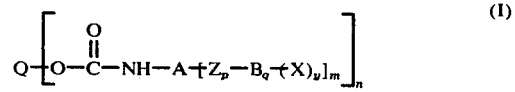

(I)

and

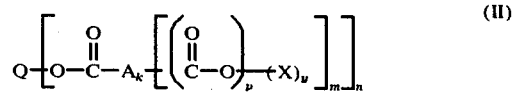

(II)

wherein Q is a styrene-allyl alcohol copolymeric moiety remaining after $n$ hydroxyl groups of a styrene-allyl alcohol copolymer have reacted to form (i) $n$ urethane linkages in Formula I and (ii) $n$ ester linkages in Formula II; A and B are polyvalent organic radical members free of reactive carbon to carbon unsaturation and are independently selected from the group consisting of aryl, substituted aryl, aralkyl, substituted aralkyl, cycloalkyl, substituted aralkyl, cycloalkyl, substituted cycloalkyl, alkyl and substituted alkyl containing 1 to 36 carbon atoms and mixtures thereof, said group members can be internally connected to one another by a chemically compatible linkage selected from the group consisting of —O—, —S—, carboxylate, carbonate, carbonyl, urethane and substituted urethane, urea and substituted urea, amide and substituted amide, amine and substituted amine and hydrocarbon; Z is a divalent chemically compatible linkage selected from the group consisting of

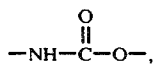

—O— and —S—; X is a member selected from the group consisting of:
a. $-(CH_2)_d-CR'=CHR$
b. $-O(CH_2)_d-CR'=CHR$
c. $-S-(CH_2)_d-CR'=CHR$
d. $-(CHR_2)_d-C\equiv CR$
e. $-O-(CH_2)_d-C\equiv CR$
f. $-S-(CH_2)_d-C\equiv CR$ and mixtures thereof; where R and R' each are independently selected from the group consisting of hydrogen and methyl radicals; $d$, $k$, $p$ and $q$ are each integers from 0 to 1; $y$ is an integer from 1 to 10; $m$ and $n$ are each integers of at least 1; with the proviso that when $n$ is 1, $y$ or $m$ is at least 2; and (2) said polythiol having a molecular weight in the range of about 94 to 20,000 of the general formula:

wherein $x$ is an integer of at least 2.

3. The process of claim 1 wherein (1) said polyene is selected from the group consisting of:
I. A reaction product of a styrene-allyl alcohol copolymer and at least one reactive unsaturated monoisocyanate which isocyanate is the reaction product of toluene diisocyanate and unsaturated alcohol selected from the group consisting of allyl alcohol, crotyl alcohol, trimethylolpropane diallyl ether, trimethylolethane diallyl ether and 2-methyl-3-butene-2-ol; the molar ratio of the toluene diisocyanate and the unsaturated alcohol being 1:1; and
II. A reaction product of a styrene-allyl alcohol copolymer and at least one reactive unsaturated monocarboxylic acid selected from the group consisting of acrylic acid, methyacrylic acid and vinylacetic acid; said styrene-allyl alcohol copolymer reactants having an equivalent weight of about 300 ± 130 and a hydroxyl group content from about 4 to 10 percent by weight; and (2) said polythiol is an ester of a polyhydric alcohol containing at least 2 hydroxyl groups per molecule and at least one mercaptocarboxylic acid selected from the group consisting of mercaptoacetic acid, α-mercaptopropionic acid and β-mercaptopropionic acid.

4. The process of claim 1 wherein the composition contains from 0.10 to 15 parts by weight of 100 parts by weight of said polyene and said polythiol of a liquid polyene containing at least 2 reactive carbon-to-carbon bonds per molecule, 5. A process of forming a solder resistant photoresist on a printed circuit board which comprises:
A. applying to the electrically conductive surface of a printed circuit board having holes therethrough a solid layer of a solder resistant photocurable composition consisting essentially of
1. a solid polyene which is a reaction product of a styrene-allyl alcohol copolymer and a member selected from the group consisting of at least one reactive unsaturated monoisocyanate and at least one reactive unsaturated monocarboxylic acid, said polyene containing at least 2 reactive carbon to carbon bonds per molecule; and
2. a liquid polythiol containing at least 2 thiol groups per molecule, the total combined functionality of (a) the reactive unsaturated carbon to carbon bonds per molecule in the polyene and (b) the thiol groups per molecule in the polythiol being greater than 4;
B. imagewise exposing selected areas of said composition to actinic radiation, thereby curing the exposed areas of said composition;
C. removing the unexposed uncured areas of the curable composition, thereby baring the surface of said printed circuit board beneath the removed uncured areas of the composition
D. inserting the leads of electrical components where desired through the holes in the bared areas of the printed circuit board;
E. passing the printed circuit board over a flux bath, and thereafter over a solder bath maintained at a temperature in the range of 400° to 600° F, thereby soldering said electrical components to said board.

6. The process according to claim 5 wherein (1) said polyene is selected from the group consisting of polyene compounds having the general formula:

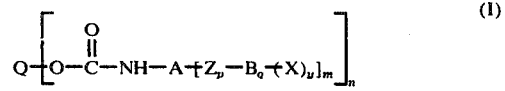

and

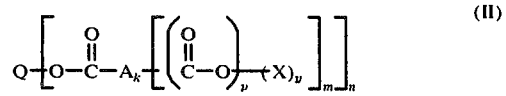

wherein Q is a styrene-allyl alcohol copolymeric moiety remaining after $n$ hydroxyl groups of a styrene-allyl alcohol copolymer have reacted to form (i) $n$ urethane linkages in Formula I and (ii) $n$ ester linkages in Formula II; A and B are polyvalent organic radical members free of reactive carbon to carbon unsaturation and are independently selected from the group consisting of aryl, substituted aryl, aralkyl, substituted aralkyl, cycloalkyl, substituted aralkyl, cycloalkyl, substituted cycloalkyl, alkyl and substituted alkyl containing 1 to 36 carbon atoms and mixtures thereof, said group members can be internally connected to one another by a chemically compatible linkage selected from the group consisting of —O—, —S—, carboxylate, carbonate, carbonyl, urethane and substituted urethane, urea and substituted urea, amide and substituted amide, amine and substituted amine and hydrocarbon; Z is a divalent chemically compatible linkage selected from the group consisting of

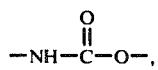

—O— and —S—; X is a member selected from the group consisting of:

a. $-(CH_2)_d-CR'=CHR$
b. $-O(CH_2)_d-CR'=CHR$
c. $-S-(CH_2)_d-CR'=CHR$
d. $-(CH_2)_d-C\equiv CR$
e. $-O-(CH_2)_d-C\equiv CR$
f. $-S-(CH_2)_d-C\equiv CR$ and mixtures thereof: where R and R' each are independently selected from the group consisting of hydrogen and methyl radicals; $d$, $k$, $p$ and $q$ are each integers from 0 to 1; $y$ is an integer from 1 to 10; $m$ and $n$ are each integers of at least 1; with the proviso that when $n$ is 1, $y$ or $m$ is at least 2; and (2) polythiol having a molecular weight in the range of about 94 to 20,000 of the general formula:

$$R_8(SH)_x$$

wherein x is an integer of at least 2.

7. The process of claim 5 wherein (1) said polyene is selected from the group consisting of:

I. A reaction product of a styrene-allyl alcohol copolymer and at least one reactive unsaturated monoisocyanate which isocyanate is the reaction product of toluene diisocyanate and unsaturated alcohol selected from the group consisting of allyl alcohol, crotyl alcohol, trimethylolpropane diallyl ether, trimethylolethane diallyl ether and 2-methyl-3-butene-2-ol; the molar ratio of the toluene diisocyanate and the unsaturated alcohol being 1:1; and II. A reaction product of a styrene-allyl alcohol copolymer and at least one reactive unsaturated monocarboxylic acid selected from the group consisting of acrylic acid, methyacrylic acid and vinylacetic acid; said styrene-allyl alcohol copolymer reactants having an equivalent weight of about 300 ± and a hydroxyl group content from about 4 to 10 percent by weight; and (2) said polythiol is an ester of a polyhydric alcohol containing at least 2 hydroxyl groups per molecule and at least one mercaptocarboxylic acid selected from the group consisting of mercaptoacetic acid, α-mercaptopropionic acid and α-mercaptopropionic acid.

8. The process of claim 5 wherein the composition contains from 0.10 to 15 parts by weight of 100 parts by weight of said polyene and said polythiol of a liquid polyene containing at least 2 reactive carbon-to-carbon bonds per molecule.

* * * * *

UNITED STATES PATENT AND TRADEMARK OFFICE
CERTIFICATE OF CORRECTION

PATENT NO. : 4,018,940
DATED : April 19, 1977
INVENTOR(S) : Charles R. Morgan

It is certified that error appears in the above-identified patent and that said Letters Patent are hereby corrected as shown below:

In the Claims:

In column 23, line 14, after "(2)" please insert the word --said--.

Signed and Sealed this twenty-sixth Day of July 1977

[SEAL]

Attest:

RUTH C. MASON
*Attesting Officer*

C. MARSHALL DANN
*Commissioner of Patents and Trademarks*